(12) United States Patent
Losehand et al.

(10) Patent No.: US 9,129,836 B2
(45) Date of Patent: Sep. 8, 2015

(54) HIGH-FREQUENCY SWITCHING TRANSISTOR AND HIGH-FREQUENCY CIRCUIT

(71) Applicant: Infineon Technologies AG, Neubiberg (DE)

(72) Inventors: Reinhard Losehand, Munich (DE); Hans Taddiken, Munich (DE); Udo Gerlach, Munich (DE)

(73) Assignee: Infineon Technologies, AG, Neubiberg (DE)

( * ) Notice: Subject to any disclaimer, the term of this patent is extended or adjusted under 35 U.S.C. 154(b) by 27 days.

(21) Appl. No.: 14/016,924

(22) Filed: Sep. 3, 2013

(65) Prior Publication Data

US 2014/0001550 A1     Jan. 2, 2014

Related U.S. Application Data

(60) Division of application No. 12/421,920, filed on Apr. 10, 2009, now Pat. No. 8,525,272, which is a continuation of application No. 11/267,013, filed on Nov. 4, 2005, now Pat. No. 7,564,103.

(30) Foreign Application Priority Data

Nov. 5, 2004 (DE) .......................... 10 2004 053 558
Dec. 21, 2004 (DE) .......................... 10 2004 061 561
Oct. 14, 2005 (DE) .......................... 10 2005 049 247

(51) Int. Cl.
| | |
|---|---|
| *H01L 27/088* | (2006.01) |
| *H01L 29/10* | (2006.01) |
| *H03K 17/687* | (2006.01) |
| *H03K 17/693* | (2006.01) |

(52) U.S. Cl.
CPC .......... *H01L 27/088* (2013.01); *H01L 29/1083* (2013.01); *H01L 29/1087* (2013.01); *H03K 17/6871* (2013.01); *H03K 17/693* (2013.01)

(58) Field of Classification Search
CPC .............. H01L 27/088; H01L 29/1083; H01L 29/1087; H01K 17/6871; H03K 17/693
See application file for complete search history.

(56) References Cited

U.S. PATENT DOCUMENTS

| | | | |
|---|---|---|---|
| 7,247,926 B2* | 7/2007 | Losehand | 257/592 |
| 7,564,103 B2* | 7/2009 | Losehand et al. | 257/376 |
| 2003/0160287 A1* | 8/2003 | Uenishi | 257/373 |

* cited by examiner

Primary Examiner — Long Pham
(74) Attorney, Agent, or Firm — Maginot, Moore & Beck LLP (57) ABSTRACT

A circuit includes first, second, third and fourth terminals, and first and second switches. The first switch switches a first signal from the first terminal to the second terminal or from the first terminal to the fourth terminal. The second switch switches a second signal from the third terminal to the second terminal or from the third terminal to the fourth terminal. The first switch comprises a first switching element with a first high-frequency switching transistor connected between the first terminal and the second terminal, and a second switching element with a second high-frequency switching transistor connected between the first terminal and the fourth terminal. The second switch comprises a third switching element with a third high-frequency transistor connected between the third terminal and the second terminal and comprises a fourth switching element with a fourth high-frequency switching transistor connected between the third terminal and the fourth terminal.

3 Claims, 8 Drawing Sheets

HIGH-FREQUENCY SWITCHING TRANSISTOR AND HIGH-FREQUENCY CIRCUIT

This application is a division of co-pending U.S. patent application Ser. No. 12/421,920, filed Apr. 10, 2009, which is continuation of U.S. patent application Ser. No. 11/267,013, filed Nov. 4, 2005, now U.S. Pat. No. 7,564,103, which in turn claims priority from German Patent Application No. 102004053558.2, which was filed on Nov. 5, 2004, German Patent Application No. 102004061561.6, which was filed on Dec. 21, 2004, and German Patent Application No. 102005049247.9, which was filed on Oct. 14, 2005, all of which are incorporated herein by reference in its entirety.

FIELD OF THE INVENTION

The present invention relates to the technical field of semiconductor electronics and particularly to the technical partial field of high-frequency MOS transistors.

DESCRIPTION OF THE PRIOR ART

High-frequency switches have the task to pass or block high-frequency signals. In the passing case, the same should be characterized by an ohmic resistance, which is as small as possible, and in the blocking case, by a constant capacity, which is as small as possible. They can be realized by different types of switching elements. In silicon technology, high-frequency switches are often realized with bipolar or MOS transistors (MOS=metal oxide semiconductor). However, in the off-state, they require a base or substrate voltage, respectively, as high as the high-frequency amplitude which is to be blocked. Thereby, the switchable power of the available bias voltage is limited. This means that in the case of a silicon MOS transistor, the passing and blocking case can be easily realized when the high-frequency signals to be switched are limited to a low amplitude of these high-frequency signals. The passing case is then obtained for an n channel MOS transistor by applying a positive gate source voltage, wherein the same has a small resistance. With proper transistor dimensioning, the control voltage can remain below 3 volt and thus be within the operating voltage used in mobile radio systems. The allowed current amplitude can be set via the width/length ratio of the channel. The blocking case occurs by changing the polarity, i.e. a positive source gate voltage disconnects the current and the drain gate capacity remains as load impedance. The starting voltage should be around 0 volt. The maximum voltage amplitude occurs through the secondary condition that the drain bulk diode must not be polarized in forward direction, at maximum 3.5 volt, when the maximum bias voltage is equal to the supply voltage of 3 volt and the diode can still be operated with 0.5 volt in forward direction.

In order to able to switch higher powers by high-frequency switches, conventionally, these high-frequency switches are realized outside the RF-Ics (RF-ICs=radio frequency integrated circuit) in the form of pin diodes or GaAs transistor switches. The same can be operated with low or without bias voltage, respectively. However, the higher costs are disadvantageous, which are incurred by the additional parts and which make an integration with a unitary semiconductor technology, such as a pure silicon technology, more difficult.

The maximum control of a high-frequency switching transistor, such as a conventional MOS transistor is often determined by its parasitic lateral bipolar transistor, which should not come into the passing region, when the same is realized by a contiguous silicon substrate. A basic measure for making the parasitic bipolar transistor resistant to large signals, has already been described in EP 03028319.6, wherein this patent application relates to the optimization of parasitic bipolar transistors, wherein, however, these transistors are significantly lossy when high powers are to be switched.

WO 03/1032431 A3 shows a circuit and a method for switching high-frequency signals, wherein the high-frequency circuit is produced in a silicon on insulator technology. The high-frequency circuit comprises pairs of switching and shunt transistor groups, which are used to alternately couple high-frequency input signals to a common high-frequency node. The switching and shunt transistor groups comprise one or several MOSFET transistors, which are connected in a "stacked" or series configuration. By stacking transistor groups, the breakdown voltage across the switching transistors connected in series is increased. A fully integrated high-frequency switch is described, which comprises a digital control logic in a negative voltage generator, which is integrated with the high-frequency switching elements. In one embodiment of the WO 03/032431 A3, the fully integrated high-frequency switch comprises an integrated oscillator, a charge pump circuit, a level shifter, voltage divider switching circuits and a high-frequency buffer circuit.

U.S. Pat. No. 5,777,530 comprises a circuit attenuator, which comprises a first terminal connected to an antenna, a second terminal connected to a transmitter, and a third terminal connected to a receiver, whereby switching of a first state and a second state becomes possible. In the first state, the first terminal is connected to a second terminal, the first terminal is electrically isolated from the third terminal, the third terminal is connected to ground and the circuit attenuator is electrically controllable to vary an attenuation amount between the first terminal and the second terminal and at the same time to maintain a relationship that an impedance Z1 seen from the first terminal is essentially equal to a second impedance Z2 seen from the second terminal. In the second state, the first terminal is connected to the third terminal, the first terminal is electrically isolated from the second terminal and the second terminal is connected to ground and the circuit attenuator is electrically controllable to vary an attenuation amount between the first and the third terminal while a relationship is maintained that the impedance Z1 seen from the first terminal is essentially equal to an impedance Z3 seen from the third terminal.

WO 9946859 discloses a microwave circuitry with one or several semiconductor switching elements, characterized by at least one semiconductor switching element being controlled or switched, respectively, by changing the drain and source potential. These circuits can be used in mobile phones or mobile transceivers.

US-2003/0090313 A1 shows a high-frequency circuit and a method for switching high-frequency signals. The high-frequency circuit is produced in a silicon on isolator technology (SOI). The high-frequency circuit comprises pairs of switching and shunt transistor groups, which are used to alternately couple high-frequency signals to a common high-frequency node. The switching and shunt transistor grouping pairs are controlled by a circuit control voltage and it's inverse. The circuit and shunt transistor groups comprise one or several MOSFET transistors, which are connected in a "stacked" or series circuit.

U.S. Pat. No. 5,812,939 comprises a circuit-semiconductor integrated circuit, wherein a switch for a high-frequency signal is formed by four field effect transistors stages, which are connected in series to the first to fourth signal path, which is arranged in a ring shape, and two connected field effect transistors stages, which are in a shunt position with regard to the signal path, so that two signal paths are disposed between two opposite field effect stages.

In order to eliminate problems of parasitic lateral bipolar transistors, which occur on a contiguous silicon substrate, the high-frequency power switch can also be generated in a gallium arsenide technology or on a substrate consisting of a thin silicon layer of a thick sapphire substrate, so-called silicon on sapphire (SOS). Both technologies are more expensive than Si technology.

Additionally, when using gallium arsenide technology or SOS technology, high-frequency power switches can only be integrated sufficiently compact in a limited way in an integrated circuit.

SUMMARY OF THE INVENTION

It is an object of the present invention to provide a high-frequency switch, which has better integration characteristics compared to conventional high-frequency switches and can be produced in a more cost-effective way.

In accordance with a first aspect, the present invention provides a high-frequency switching transistor, having: a substrate having a substrate dopant concentration; a barrier region bordering on the substrate, comprising a first conductivity type and having a barrier region dopant concentration, which is higher than the substrate dopant concentration; a source region embedded in the barrier region, comprising a second conductivity type different to the first conductivity type, and having a source region dopant concentration, which is higher than the barrier region dopant concentration; a drain region embedded in the barrier region and disposed offset from the source region, comprising the second conductivity type and having a dopant concentration, which is higher than the barrier region dopant concentration; a channel region extending between the source region and the drain region, wherein the channel region comprises a subregion of the barrier region; and an insulation region, which covers the channel region and is disposed between the channel region and a gate electrode.

In accordance with a second aspect, the present invention provides a high-frequency circuit, having: a switch with a high-frequency switching transistor, having: a substrate having a substrate dopant concentration; a barrier region bordering on the substrate, comprising a first conductivity type and having a barrier region dopant concentration, which is higher than the substrate dopant concentration; a source region embedded in the barrier region, comprising a second conductivity type different to the first conductivity type, and having a source region dopant concentration, which is higher than the barrier region dopant concentration; a drain region embedded in the barrier region and disposed offset from the source region, comprising the second conductivity type and having a dopant concentration, which is higher than the barrier region dopant concentration; a channel region extending between the source region and the drain region, wherein the channel region comprises a subregion of the barrier region; and an insulation region, which covers the channel region and is disposed between the channel region and a gate electrode; and a control circuit, which is formed to open and close the switch depending on a control signal, and wherein the control circuit is further formed to provide the gate electrode with a potential for opening the switch, and to enable a current flow between the source region and the drain region.

In accordance with a third aspect, the present invention provides a high-frequency circuit with a high-frequency switching transistor, having: a substrate having a substrate dopant concentration; a barrier region bordering on the substrate, comprising a first conductivity type and having a barrier region dopant concentration, which is higher than the substrate dopant concentration; a source region embedded in the barrier region, comprising a second conductivity type different to the first conductivity type, and having a source region dopant concentration, which is higher than the barrier region dopant concentration; a drain region embedded in the barrier region and disposed offset from the source region, comprising the second conductivity type and having a dopant concentration, which is higher than the barrier region dopant concentration; a channel region extending between the source region and the drain region, wherein the channel region comprises a subregion of the barrier region; and an insulation region, which covers the channel region and is disposed between the channel region and a gate electrode, wherein the high-frequency circuit is formed to provide the substrate of the high-frequency transistor with an offset voltage in relation to the source region and the drain region.

In accordance with a fourth aspect, the present invention provides a high-frequency circuit with a first terminal, a second terminal, a third terminal and a fourth terminal, having: a first switch, which is formed to switch a first signal from the first terminal to the second terminal or from the first terminal to the fourth terminal; and a second switch, which is formed to switch a second signal from the third terminal to the second terminal or from the third terminal to the fourth terminal, wherein the first switch comprises a first switching element with a first high-frequency switching transistor, which is connected between the first terminal and the second terminal, and a second switching element with a second high-frequency switching transistor, which is connected between the first terminal and the fourth terminal, and wherein the second switch comprises a third switching element with a third high-frequency transistor, which is connected between the third terminal and the second terminal and comprises a fourth switching element with a fourth high-frequency switching transistor, which is connected between the third terminal and the fourth terminal, wherein the first, second, third and fourth high-frequency switching transistor are controllable such that when the first high-frequency switching transistor is opened, the fourth high-frequency switching transistor is opened as well and when the first high-frequency switching transistor is closed, the fourth high-frequency switching transistor is closed as well, and that when the second high-frequency switching transistor is opened, the third high-frequency switching transistor is opened as well and when the high-frequency switching transistor is closed, the third high-frequency switching transistor is closed as well; wherein the first, second, third and fourth high-frequency switching transistor have: a substrate having a substrate dopant concentration; a barrier region bordering on the substrate, comprising a first conductivity type and having a barrier region dopant concentration, which is higher than the substrate dopant concentration; a source region embedded in the barrier region, comprising a second conductivity type different to the first conductivity type, and having a source region dopant concentration, which is higher than the barrier region dopant concentration; a drain region embedded in the barrier region and disposed offset from the source region, comprising the second conductivity type and having a dopant concentration, which is higher than the barrier region dopant concentration; a channel region extending between the source region and the drain region, wherein the channel region comprises a subregion of the barrier region; and an insulation region, which covers the channel region and is disposed between the channel region and a gate electrode.

The present invention is based on the knowledge that by using a barrier region bordering on the substrate, into which the source region and the drain region are embedded, it can be avoided that charge carriers can leave the channel within one of the two half-waves of a high-frequency oscillation in the passing state. If, for example, an n doped semiconductor material is used for the source region and the drain region, as well as a p doped semiconductor material for the barrier region, it can be avoided by such an arrangement of the barrier region and the embedded drain and source region, that electrons leave the channel in the negative half-wave of a high-frequency oscillation and can leak away over the substrate. Thus, the barrier region functions as injection barrier for electrons from the channel region into the substrate. If, alternatively, a p doped semiconductor material is used for the source and the drain region, and an n doped semiconductor material for the barrier region, this barrier region functions again as injection barrier for holes from the p channel in the positive half-wave of a high-frequency vibration.

Thus, by disposing such injection barriers, it can advantageously be ensured that even with high amplitudes of a high-frequency signal applied between the source and drain region, the high-frequency switching transistor cannot reach the passing region. The different dopant concentration of the barrier region compared to the source region and the drain region as well as the substrate offers the further advantage that a broad space-charge region is formed, which then has the effect that merely a low parasitic capacitance is formed.

According to a special embodiment of the inventive high-frequency switching transistor, the same further comprises: a further barrier region having the second conductivity type, wherein further the further barrier region has a dopant concentration, which is higher than the substrate dopant concentration; and a substrate terminal region embedded in the further barrier region, having the first conductivity type and a substrate terminal region dopant concentration, which is higher than the dopant concentration of the further barrier region.

This offers the advantage that it can be avoided by the substrate terminal region embedded in the further barrier region, and the drain region embedded in the barrier region, that the np or pn diode, respectively, formed between the drain region and the substrate terminal region, becomes conductive during polarization in forward direction of the high-frequency voltage in the off state.

It is favorable when the first conductivity type comprises a p doped semiconductor material and the second conductivity type an n doped semiconductor material. This offers the advantage that by respectively doped regions of the high-frequency switch a low resistance and thus a low insertion attenuation in high to highest frequencies becomes possible.

Alternatively, the first conductivity type can comprise an n doped semiconductor material and the second conductivity type a p doped semiconductor material. This offers the advantage that even when using certain substrate materials and corresponding majority charge carriers in the corresponding regions, a specific switching behavior can be developed (for example a short delay when using holes as majority charge carriers compared to electrons as majority charge carriers). Thus, the choice of doping types of the first and second conductivity type offers an additional degree of freedom in designing a corresponding high-frequency switch.

Further, in a favorable embodiment, the substrate dopant concentration can be less than $10^{14}$ dopant atoms per cubic centimeter. This offers the advantage that conventional and easily available substrate materials can be used for producing such a high frequency switch.

Further, the drain region dopant concentration, the source region dopant concentration or the substrate terminal region dopant concentration can be higher than $10^{18}$ dopant atoms per cubic centimeter. This offers the advantage of a good, i.e. high conductivity of the corresponding regions, which has the effect of a low resistance of the high-frequency switching transistor in the passing case.

In a further embodiment of the inventive high-frequency switching transistor, the barrier region dopant concentration or the dopant concentration of the further barrier region can lie between $10^{14}$ and $10^{18}$ dopant atoms per cubic centimeter. This offers high flexibility in choosing the dopant concentration of the barrier region or the further barrier region to obtain the desired functionality of the injection barrier effect.

Further, a thickness of the barrier region between the drain region and the substrate or a thickness of the barrier region between the source region and the substrate can lie within a range of values between 0.05 µm and 1 µm. This offers the advantage that depending on the desired field of application, the thickness of the space-charge region between the drain region or the source region and the substrate can be influenced, wherein the parasitic capacitance can be influenced.

A thickness of the further barrier region between the substrate and the substrate terminal region can also lie in a range of values between 0.05 µm and 1 µm. This offers the advantage that the thickness of the space-charge region between the substrate terminal region and the substrate can be influenced, independent of a thickness of the barrier region.

In a further embodiment, the channel region can comprise a plurality of subchannel regions, which are disposed in series between the source region and the drain region, wherein the insulation region further comprises a plurality of subregions, and the gate electrode comprises a plurality of subgate electrodes, wherein every subinsulation region covers one subchannel region, and every subinsulation region is disposed between the corresponding subchannel region and a subgate electrode. This offers the advantage that for switching high-frequency signals with high amplitudes, a reduction of the distance between source region and drain region is possible. Without such an arrangement with subchannel regions and corresponding subinsulation regions and subgate electrodes, switching of such high-frequency signal amplitudes would not be possible or only with high space requirements on the semiconductor chip.

In a further embodiment, the distance between the drain region and the substrate terminal region is at least 1 µm. This ensures advantageously a sufficient breakdown strength of the high-frequency switch, particularly the diode formed between the drain region and the substrate terminal region.

Furthers the subchannel region can have a minimum length of 0.1 µm. This offers the advantage that such a high-frequency switch has a fast pass-through or switch-on behavior compared to conventional high-frequency switches.

Further, the channel region can also have a width, which lies within a range of values of 100 µm to 5000 µm, which has an advantageous effect on the reduction of the (inner) resistance of such a high-frequency switch in the passing case.

Further, the control circuit can be formed to apply an offset voltage between the source region and the drain region opposite to the substrate. This offers the advantage that even in the passing region depleting the barrier regions of charge carriers is ensured. Thereby, reverse currents can be avoided, which has the effect that the nonlinear parallel conductance caused by parasitic effects is reduced and the insertion attenuation is improved, which then has the effect that harmonic waves generated in the passing case are reduced or attenuated, respectively.

According to a further embodiment, the control circuit is further formed to provide the substrate terminal region with a potential by using a resistor connected in series to the substrate terminal region. This offers the advantage that the generation of high-frequency substrate currents and thus of harmonic waves can be avoided by such a connection of the substrate across the preferably high ohmic resistance. Then, no offset voltage between source region and drain region opposite to the substrate is required, whereby the full supply voltage can be used for operating the gate electrode.

Further, in order to realize a high-frequency power switch, a high-frequency circuit can be realized on a high-resistance silicon substrate of typically 500-1000 Ohm per centimeter. Here, the above-described MOS transistor is used for such a circuit. For every HF port of the circuit, preferably, a so-called shunt transistor is used besides the actual switching transistor. Hereby, the high-frequency isolation of this high-frequency port, i.e., the high-frequency port with the shunt transistor, is improved in relation to other high-frequency ports of such a high-frequency circuit. Further, a negative substrate bias voltage can be used, which is generated, for example, on the substrate by a substrate voltage generator. Hereby, the advantages of lower production costs and an improved integration ability of a high-frequency power switch designed in such way can be realized, compared to what would be possible based on gallium arsenide technology or SOS technology.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

In the figures, equal or similar reference numbers are used for equal or similar elements, wherein a repeated description of these reference numbers is omitted.

Figure 1A:
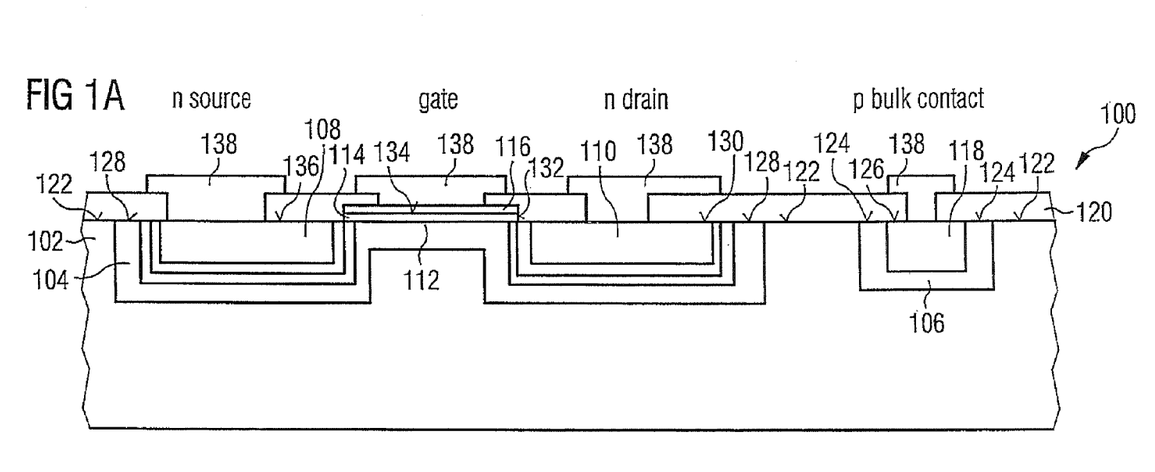
FIG. 1a are embodiments of high-frequency switching and 1b transistors with injection barriers between the source and drain regions to the substrate.

FIG. 1a shows a high-frequency switching transistor 100, having a substrate 102 as well as barrier region 104 embedded in the substrate 102 and a further barrier region 106 embedded in the substrate 102. The substrate 102 can be a semi-insulating semiconductor material, wherein conventional semiconductor substrates with p doping and a substrate doping concentration of, for example, less than $10^{14}$ dopant atoms per cubic centimeter can be used for such a substrate 102. For the barrier region 104, for example, dopant atoms for a p doping can be introduced into the substrate 102, so that the dopant concentration of the barrier region (i.e. the barrier region dopant concentration) is higher than the substrate dopant concentration. Thereby, the barrier region dopant concentration can be preferably in a range of values between $10^{14}$ and $10^{18}$ dopant atoms per cubic centimeter.

Further, another barrier region 106 can be embedded in the substrate 102, off-center to the barrier region 104. The further barrier region 106 can thereby be realized by doping with an n doped dopant, so that the further barrier region 106 consists of an n doped semiconductor material.

A source region 108 and a drain region 110 are embedded in the barrier region 104, wherein the source region 108 is disposed off-center from the drain region 110. The source region 108 and the drain region 110 have an n doping with a dopant concentration of, for example, more than $10^{19}$ dopant atoms per cubic centimeter. By offsetting the source region 108 in relation to the drain region 110, a channel region 112 is formed, which comprises at least part of the barrier region 104, wherein the channel region 112 is limited in relation to the substrate 102 by the subregion of the barrier region 104. This means that the channel region comprises either only a subregion of the barrier region 104 (and also borders on the substrate with the same) or a further region, which is disposed on the side of the subregion of the barrier region 104 opposite to the substrate. This further region can, for example, have an opposite conductivity type in relation to the barrier region, so that an np or pn junction, respectively, is formed by the further region and the subregion of the barrier region 104, which wakes leaking of charge carriers from the channel region 112 significantly more difficult.

Further, the channel region 112 is covered by an insulation region 114, whereon a gate electrode 116 is disposed. Thereby, a MOS transistor structure results, which, compared to a conventional MOS transistor, is "shielded" from the substrate 102 by a barrier region 104.

Further, a substrate terminal region 118 is embedded in the further barrier region 106, which has, for example, a p doping with a dopant concentration, which is higher than the dopant concentration of the further barrier region 106 (for example more than $10^{19}$ dopant atoms per cubic centimeter).

For ensuring protection of such a high-frequency switch against mechanical and chemical environmental influences, a cover layer 120 can be deposited on a surface 122 of the substrate 102, a surface 124 of the further barrier region 106, a surface 126 of the substrate terminal region 118, a surface 128 of the barrier region 104, a surface 130 of the drain region 110, a side face 132 of the insulation layer 114 and the gate electrode 116, a surface 134 of the gate electrode 116 as well as a surface 136 of the source region 108. For electrically contacting the source region 108, the gate electrode 116, the drain region 110 and the substrate terminal region 118, corresponding contact terminals 138 are connected via corresponding openings in the cover layer 120 to the structures, which are to be contacted respectively.

Thus, the high-frequency switch 100 resulting from the above description comprises the barrier region 104, which restricts the MOS transistor formed by the source region 108, the channel region 112 and the drain region 110 against the substrate 102. Further, the substrate terminal region 118 is also limited in relation to the substrate 102 by the further barrier region 106.

By complementary injection barriers at the diffusion regions of source (region), drain (region) and bulk (substrate terminal region), injection of minority carriers is avoided. Particularly, in the high-frequency switches disclosed in the present application in the form of the MOS transistor, an injection barrier below the channel is disclosed, which can ensure, that electrons do not leave the channel in the negative half-wave in the passing state (and can, for example, leak to the substrate contact).

By integrating a hole injection barrier (further barrier region 106) with n doping around the substrate terminal region 118 of n channel MOS transistors, as they are illustrated in FIG. 1*a*, as well as by integrating an electron injection barrier (barrier region 104 with the p doping) around the drain region 110, it can be avoided that the np diode between drain region 110 and substrate terminal region 118 becomes conductive during polarization in forward direction of the high-frequency voltage in the off state. Particularly, in the on state, with high amplitudes, the source region 118 as well as the channel region 112 are polarized in forward direction, so that here also an electron emission barrier (in the form of the barrier region 104) exists, to ensure a sufficient insulation to adjacent transistors in an integrated circuit.

Thereby, a weakly p doped layer subsequent to a n doped contact region generates an electron emission barrier, and a weakly n doped layer subsequent to a p doped contact region generates a hole emission barrier. The $n^+pn^+$ doping profile of a transistor shown in FIG. 1*a* is then replaced by a $n^+pIpn^+$ doping profile, with a very weakly or almost undoped I zone in the center, respectively; a $pp^+$ substrate terminal region (bulk contact) is replaced by an $Inp^+$ doping profile. A p zone is introduced in the channel region.

Figure 1B:
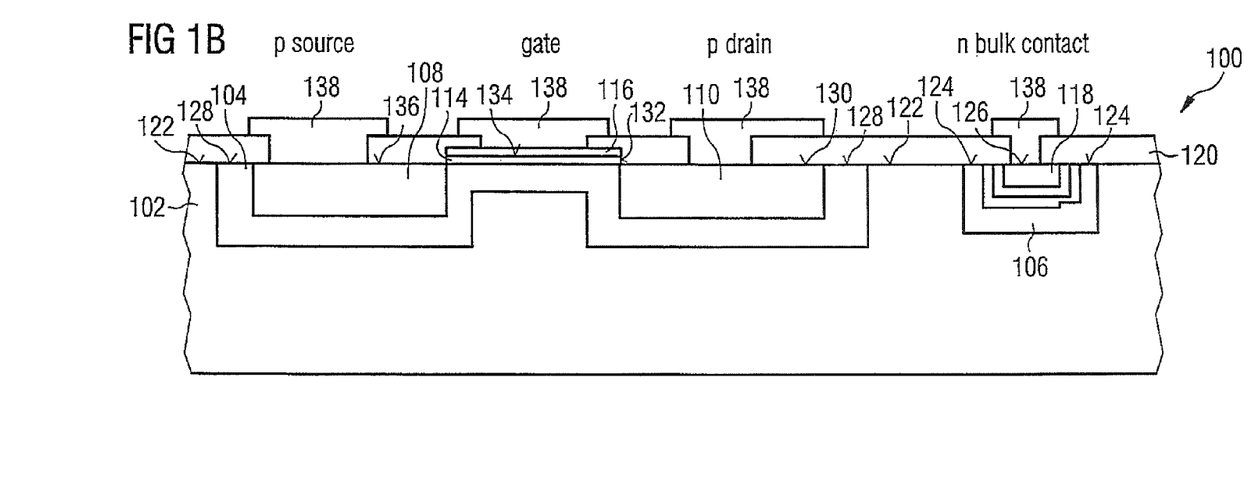

In principle, p channel MOS transistors can also be used as such high-frequency switches 100, as illustrated in FIG. 1*b*. There, hole emission barriers are exchanged for electron emission barriers and vice versa. This means that the structural arrangement between the high-frequency switches 100 illustrated in FIGS. 1*a* and 1*b* is the same, apart from the conductivity type of the barrier region 104, the source region 108, the drain region 110, the further barrier region 106 as well as the substrate terminal region 118. In other words, this means that the barrier region 104 as well as the substrate terminal region 118 are n doped, while the source region 108, the drain region 110 as well as the further barrier region 106 are p doped. In such a case, the holes in the channel region 112 would no longer leave the channel in the positive half-wave and could, for example, leak away to the substrate terminal region.

The high-frequency switching transistors in the form of MOS transistors, as illustrated in FIGS. 1*a* and 1*b*, can be made resistant against large signals by such emission barriers, particularly when the bias voltages are applied low-resistively in the blocking case. With high-resistance bias voltage feeding, which can be realized much easier, problems arise sometimes with the height of the high-frequency amplitude, which such a high-frequency switching transistor can deal with in the blocking state. Due to the symmetrical capacitive coupling of the gate voltage to the drain and source voltage, it already opens its channel (with a starting voltage of 0V) during amplitudes, which are twice as high as the gate source bias voltage.

Figure 2:
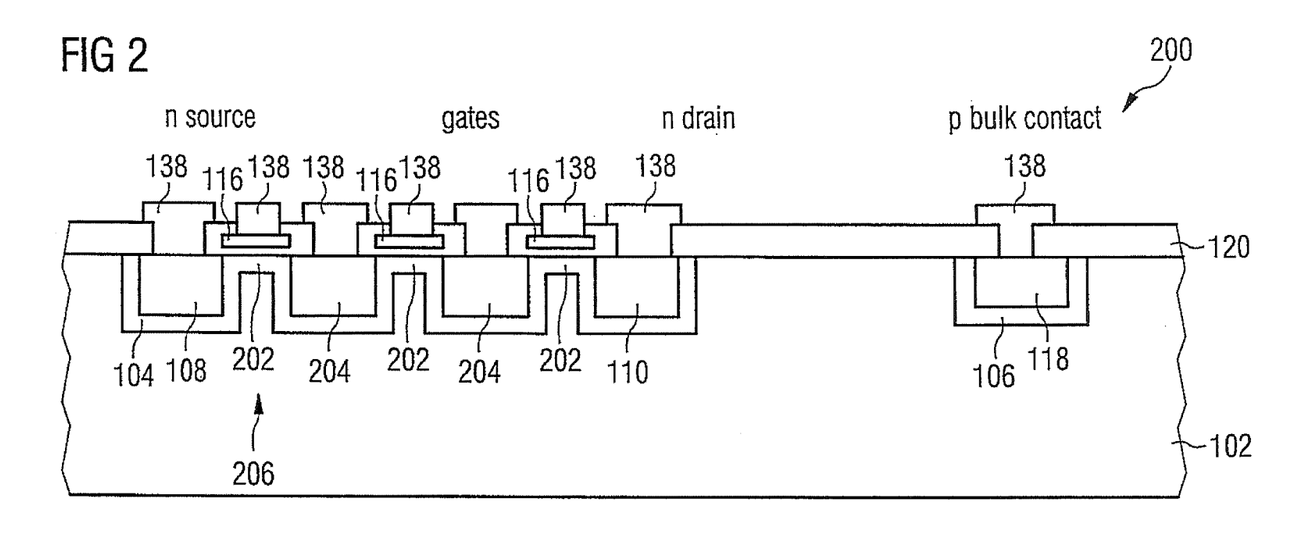
FIG. 2 is a further embodiment of a high-frequency switching transistor having several gate electrodes.

For applications as high-frequency switching transistor, this is very often not sufficient, so that a multigate structure as shown in FIG. 2 is used instead. Such a multigate structure 200 has an analog structure to the high-frequency transistor 100 illustrated in FIG. 1*a*, wherein, however, the difference results that the mitigate structure 200 has several subchannel regions 202, which are connected in series by intermediate auxiliary regions 204. Thus, the channel region 112 illustrated in FIGS. 1*a* and 1*b* is divided into a plurality of subchannel regions 202, wherein several subtransistors result by serially connecting the individual subchannel regions 202 to the auxiliary regions 204 between the source region 108 and the drain region 110, and wherein the high-frequency amplitude effective in every subtransistor is sub-divided proportionally to the number of its gates, so that the maximum possible high-frequency amplitude is correspondingly multiplied.

The mode of operation of the above-described high-frequency transistors can be described in more detail as follows:

If a sufficiently high positive voltage is applied to the n source contact 138 of the subtransistor 206 with drain source voltage 0V relative to the substrate contact terminal region 118 (which corresponds to a negative substrate bias voltage), the substrate (region) 102 between the contact 138 of the substrate terminal region 118) the auxiliary region 204 of the subtransistor 206 functioning as drain region and the source region 108 will be depleted. The dimensioning should be such that this region is already completely free of charge carriers during low bias voltage, which is smaller than the supply voltage. The substrate is only very weakly p doped (so that, for example, a specific resistance $\rho$>500 ohm per centimeter or a dopant concentration of <$10^{13}$ dopant atoms per cubic centimeters results), so that the potential distribution is only determined by the space charge in the p and n barrier regions.

Figure 3A:
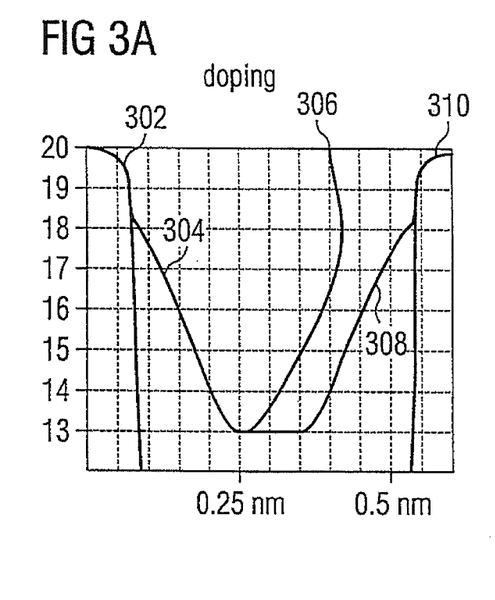
FIGs. 3a to 3c are an exemplary doping profile and an exemplary representation of potential curves in the substrate region between the source region and the drain region in the blocking case.
Figure 3B:
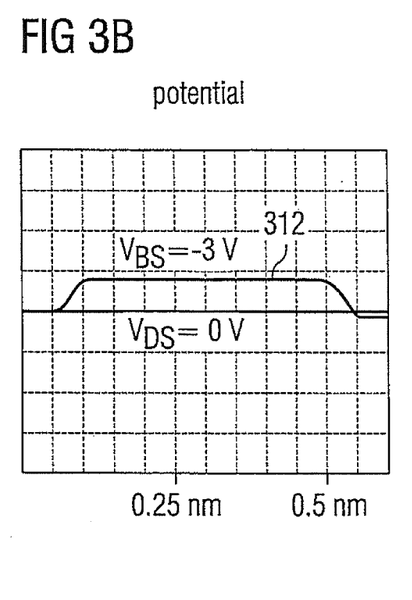
Figure 3C:
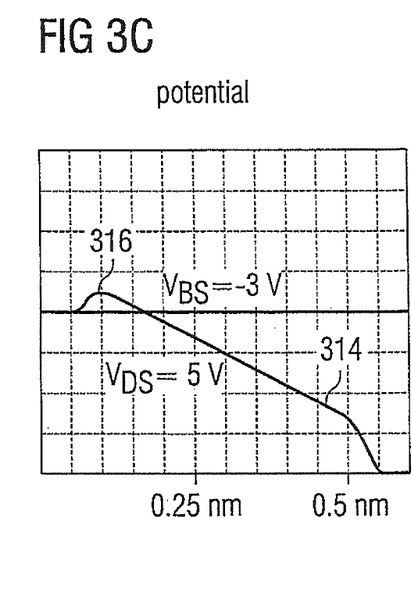

FIG. 3 shows a specific drain source doping profile in subfigure 3*a*, as it can occur, for example, in a transistor illustrated in FIGS. 1*a*, 1*b*, or as it can also occur in a subtransistor 206 illustrated in FIG. 2. Here, line 302 indicates the doping profile of the source region in the direction of the drain region, line 304 the doping profile of the barrier region 104 in the direction of the drain region, line 306 the doping profile under the channel region in the direction to the drain region, line 308 the dopant profile of the barrier region bordering on the drain region and line 310 the dopant profile in the drain region. Further, subfigure 3*b* illustrates the potential curve (line 312) in the blocking case without voltage between the source region and the drain region, and subfigure 3*c* illustrates the potential curve (line 314) between the source region and the drain region with voltage at the drain region when a voltage of −3 volt is applied between the source region and the substrate terminal region. The two p doped doping profiles (barrier region) each generate a barrier against electrode emission in the substrate region in the potential curve, which is about 1.0 volt with drain voltage 0 volt (see the potential curve in FIG. 3*b* indicated by line 312). With high positive drain source voltages, it is reduced on the left and with negative drain source voltages on the right by field punch-through. In the potential curve illustrated in FIG. 3*c* (line 314) with 5 volt drain source voltage, this voltage is mostly reduced to 0.5 volt (see position 316 in FIG. 3*c*) but still so effective that no mentionable current flows.

If the doping profile illustrated in FIG. 3*a* is used as doping profile for a subtransistor 206 illustrated in FIG. 2, such a multigate structure illustrated in FIG. 2 with three gates can switch an overall amplitude of about 15 volt, which corresponds to a power of more than two watt in a 50 ohm system.

Figure 4A:
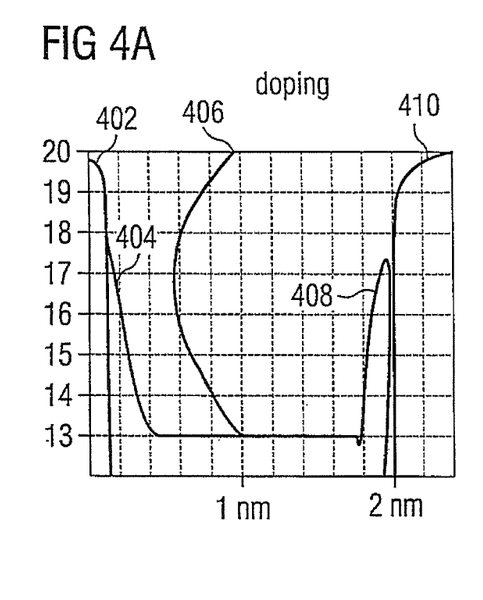
FIGS. 4a to 4c are an exemplary representation of a dopant profile and a representation of potentials between the drain region and a substrate terminal region in the blocking case.
Figure 4B:
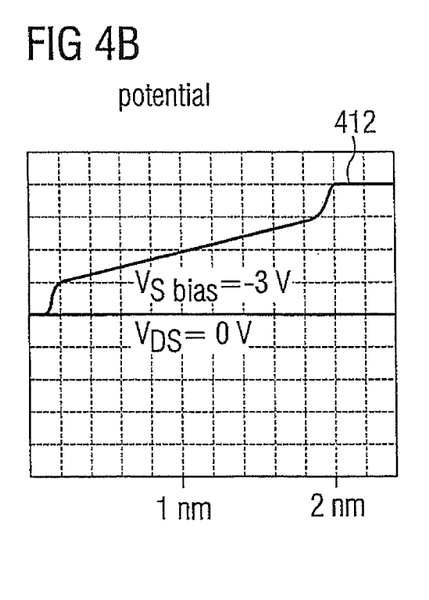
Figure 4C:
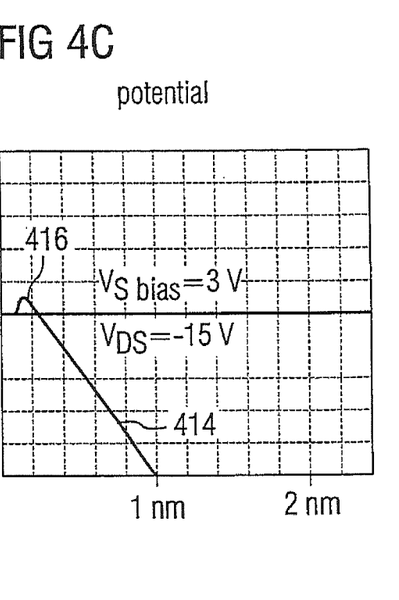

FIG. 4 shows the effect of the n doped diffusion profile in front of the substrate terminal region 118 with positive source bulk voltage. Here, line 402 indicates the dopant concentration of the substrate terminal region, line 404 the dopant concentration of the further barrier region bordering on the substrate terminal region, line 406 the dopant concentration of the substrate, line 408 the dopant concentration of the barrier region and line 410 the dopant concentration of the drain region. With 0 volt drain source voltage (as illustrated in subfigure 4b by line 412), electrons can leave the substrate region 102 towards the right and holes towards the left. This applies to all positive drain source voltages. When a negative voltage is applied to the drain region 110 (as illustrated by line 414 in FIG. 4c), a potential barrier (see position 416 in FIG. 4c) is maintained before the substrate terminal region 118, which prevents leaking-back of the holes into the substrate 102. Again, this functions, as long as the barrier is not significantly smaller than 0.5 volt. To ensure that, a minimum distance between drain region 110 and substrate terminal region 118 should be maintained, which is about 2 μm with 15 volt amplitude of a high-frequency signal.

Figure 5A:
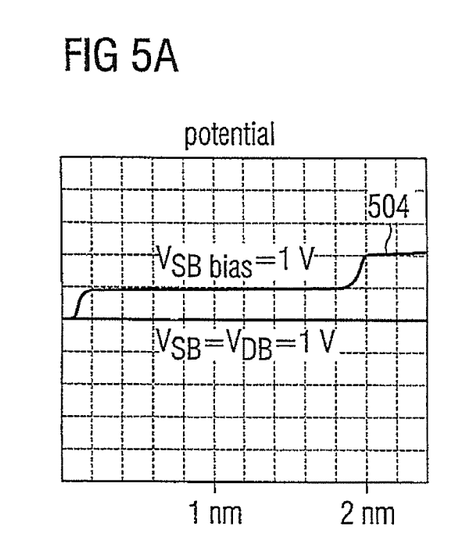
FIGS. 5a to 5c are exemplary representations of potential curves between the drain region and the substrate terminal region in the passing case.
Figure 5B:
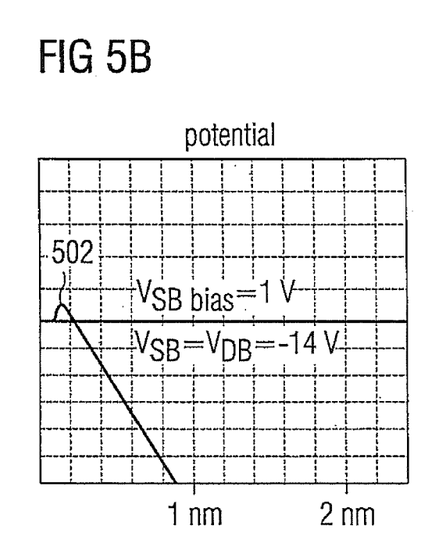
Figure 5C:
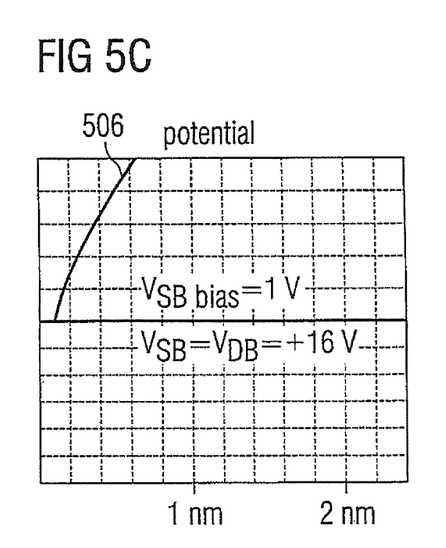

If the passing case is established by applying a positive bias voltage of 3 volt to the gate and the bias voltage 0 volt between source region and drain region, the problem arises that it is no longer ensured that the barrier regions are free of charge carriers. They will fill up with their majority carriers by reverse currents, although very slowly. The resulting nonlinear parallel conductance decreases the insertion attenuation of the passing operation and generates harmonic waves. Even when in the passing case no voltage occurs any longer between the source region and the drain region, a common voltage amplitude of source region and drain region in relation to the substrate remains, which is generated by the line impedance in proportion to the flowing current. The potential ratios, which ensure depletion of the barrier regions even in the passing case, are illustrated by the line 502 in the subfigure 5b of FIG. 5. Here, in the passing case, a bias voltage of about 1 volt should be applied at the source region and the drain region, as it is illustrated by line 504 in the subfigure 5a of FIG. 5. Then, in the subfigure 5c of FIG. 5, the potential curve is also illustrated between the drain region and substrate terminal region by the line 506, when a voltage of +16 volt is applied between the substrate terminal region and the drain region (when simultaneously a source region drain region offset voltage of 1 volt is applied). This offset or bias voltage, respectively, of 1 Volt, is lost for the effective gate voltage, so that here a deterioration of the insertion attenuation results. However, the generation of harmonic waves is avoided.

The problem of losses in the passing case can also be solved in by circuit technology, by connecting the substrate also high-resistively (for example by a high-resistance connection of the substrate region to a control circuit). This has the effect that high-frequency substrate currents can be avoided. In that case, the frill supply voltage can be used for gate control.

The dimension of the channel sizes should be scaled down as far as possible for MOS transistors, because otherwise the space requirements become too large. The smallest gate length is achieved when the drain source breakdown voltage becomes smaller than the drain source emission threshold voltage. In the case of a 20 volt transistor, this is the case with about 1.5 μm drain source spacing. When using the multigate structure as illustrated in FIG. 2, the drain source spacing can be reduced tip to about 0.5 μm. The gate widths are then typically at 2000 μm.

As has already been discussed above in more detail, a PMOS transistor can also be used. The same results from the transistor illustrated in FIG. 1a by swapping the p and n dopings. The resulting structure is then shown in FIG. 1b. Its function can be described in the same way, when correspondingly the function of electrons and holes is swapped.

Figure 6:
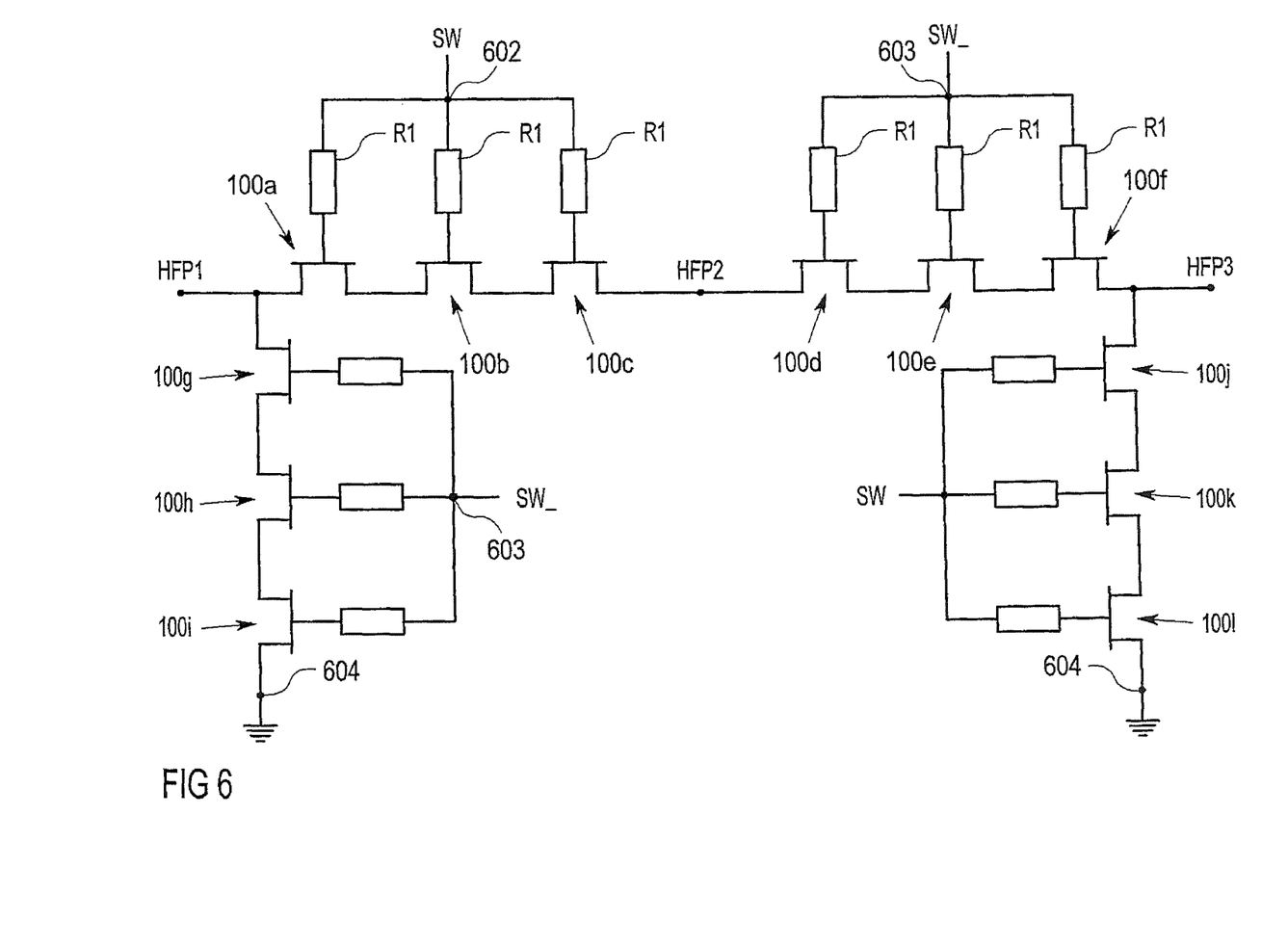
FIG. 6 is a circuit diagram of a high-frequency circuit, which can be used as high-frequency power switch.

FIG. 6 shows a circuit diagram of a high-frequency circuit using the above-described high-frequency switching transistor, which can be used as high-frequency power switch. Here, a series circuit of high-frequency switching transistors, which are, for example, structured according to the high-frequency switching transistor 100 illustrated in FIG. 1A, is disposed between a first high-frequency signal input HFP1 and a second high-frequency signal input HFP2. Here, for example, the drain terminal of the first high-frequency switching transistor 100a is connected to the first high-frequency signal input terminal HFP1, while the source terminal of the first high-frequency switching transistor 100a is connected to the drain terminal of the second high-frequency switching transistor 100b. The source terminal of the second high-frequency switching transistor 100b is connected to the drain terminal of the third high-frequency switching transistor 100c, while the source terminal of the third high-frequency switching transistor 100c is connected to the second high-frequency signal terminal HFP2. Here, the source or drain terminals of the respective high-frequency switching transistors 100a-100c can be exchanged. Further, the gates of the three mentioned high-frequency switching transistors 100a-c are each connected to a reference node 602 via a resistor R1, to which, for example, a first control signal SW can be applied. Here, the resistors R1 do not necessary all have to have the same value. The group of first to third high-frequency switching transistors 100a-c can also be seen as common switch for "switching through" a signal from the first high-frequency terminal HFP1 to the second high-frequency terminal HFP2. Analogously, a group of high-frequency switching transistors 100d-f can also be disposed between the second high-frequency signal terminal HFP2 and a third high-frequency terminal HFP3, whose connectivity is disposed analogously to the connectivity of the group of first to third high-frequency switching transistors 100a-100c. In relation to the high-frequency switch formed by the first to third high-frequency switching transistors 10a-c, the further high-frequency switch formed by the high-frequency switching transistors 100d-f can be provided with a control signal SW complementary to the control signal SW via the signal node 602, whereby closing of the further high-frequency switch with the high-frequency switching transistors 100d-f can be realized, when the high-frequency switch with the high-frequency switching transistors 100a-c is opened and vice versa. In order to obtain an improved isolation between the first high-frequency signal terminal HFP1 and the second high-frequency signal terminal HFP2, when the further switch with the high-frequency switching transistors 100d-f is opened, a shunt switch can be disposed between the first high-frequency signal terminal HFP1 and ground potential 604, which is realized by a series circuit of further three high-frequency switching transistors 100g-i, as illustrated in FIG. 6. The connectivity of the further high-frequency switching transistors 100g-i is thereby analogous to the connectivity of the first to third high-frequency switching transistors 100a-c between the first high-frequency signal terminal HFP1 and the second high-frequency signal terminal HFP2. Again, gates of the further high-frequency switching transistors 100g-i can be connected to a common node 603 via a resistor R2, which is provided with the complementary control signal SW_, which is opened by the shunt switch formed by the further high-frequency switching transistors 100g-i, when the switch formed by the high-frequency switching transistors 100d-f between the second high-frequency signal terminal HFP2 and the third high-frequency signal terminal HFP3 is opened as well. This leads to a significant improvement of insulation between the first high-frequency signal terminal HFP1 and the second high-frequency signal terminal HFP2, since the switch formed by the first to third high-frequency switching transistors 100a-c is closed, and the shunt switch formed by the high-frequency switching transistors 100g-i is opened. Thereby, a high-frequency signal applied to the first high-frequency signal terminal HFP1 is directly supplied to the ground potential at node 604, whereby an insulation between the first and second high-frequency signal terminal HFP1 and HFP2 is significantly improved. Analogously, an improvement of the insulation between the second high-frequency signal terminal HFP2 and the third high-frequency signal terminal HFP3 can be achieved by realizing a further shunt switch between the third high-frequency signal terminal HFP3 and the node 604 lying on the ground potential, which is structured analogously to the first shunt switch. This means that the further shunt switch is formed by a series circuit of further high-frequency switching transistors 100g, k and 100l, which are again structured according to the embodiment illustrated in FIG. 1a. By the fact that the further shunt switch can again be switched by the control signal SW, a simultaneous opening of the first switch between the first and second high-frequency signal terminal HFP1 and HFP2, and opening of the further shunt switch between the third high-frequency signal terminal HFP3 and the ground potential at node 604 can be realized, whereby the isolation between the second and the third high-frequency signal terminal HFP2 or HFP3, respectively, can be improved. Further, it also possible to realize an insulation between the common high-frequency signal terminal HFP2 and a further high-frequency signal terminal, which is not illustrated in FIG. 6, wherein then a further switch, such as the switch with the first to third high-frequency switching transistors 100a-c can be used, which is connected between the common high-frequency signal terminal HFP2 (second high-frequency signal terminal) and the further high-frequency signal terminal. Further, an improvement of this further high-frequency signal terminal can be realized by using a further shunt switch structured analogously to the first shunt switch.

However, in such a "multiplexer" circuit of several high-frequency signal terminals on a common high-frequency signal terminal, it should be ensured that merely one high-frequency terminal is connected to the common high-frequency signal terminal HFP2. This can, for example, be ensured by connecting not only a first switch, consisting of the high-frequency switching transistors 100a-c, but a further switch, for example with three high-frequency switching transistors connected in series, which are then switched through by a further control signal, between the first high-frequency signal terminal HFP1 and the common high-frequency signal terminal HFP2. Analogously, a further shunt switch can be connected in shunt between the corresponding shunt switch, which is connected to a further control signal, such that a signal from a high-frequency signal terminal on the common high-frequency signal terminal is only switched through to the common high-frequency signal terminal when all further high frequencies signal terminals are tied to ground potential (across the shunt switches connected in series). Hereby, a "multiplexer" circuit can be realized, where switching through front several high-frequency signal terminals to a common high-frequency signal terminal is possible, wherein at the same time a very high insulation of the other high-frequency signal terminal to the common high-frequency signal terminal is possible.

Such a circuit has been described by reference to the gallium arsenide technology or SOS substrate, such as in the above-mentioned WO 03/032531, but such a circuitry can be significantly improved when the above-described high-frequency switching transistors are used, which are based, for example, on a high-resistance silicon substrate. Further, switches with more poles can be described (such as a circuit between 1 to 8 high-frequency signal terminals on or two common high-frequency signal terminals (ports), real multiplexers and switches containing a cascade connection of switches, such as first a switch with one on four high-frequency signal terminals and then on one of the further four high-frequency signal terminals (port) a further switch (or high-frequency circuit according to the high-frequency circuit illustrated in FIG. 6 with one on four high-frequency signal terminals).

Further, the above-described high-frequency switching transistor can also be operated with negative substrate voltage (i.e., a negative voltage between the substrate terminal region 118 illustrated in FIG. 1 and the potential of the drain region 10c or the potential of the source region 108). This substrate voltage generator for providing the negative substrate voltage from the positive operating voltage can, for example, be realized by a charge pump, which is also integrated in an integrated circuit, which comprises the high-frequency circuit illustrated in FIG. 6. This circuit can also include a circuit for generating the required pump frequency. Further, a corresponding chip can comprise a logic circuit for properly controlling the switching and shunt transistors. Here, a negative voltage is also given on the gates of the of the switched-"off" transistors. However, the height of this voltage can differ from the substrate bias voltage.

Figure 7:
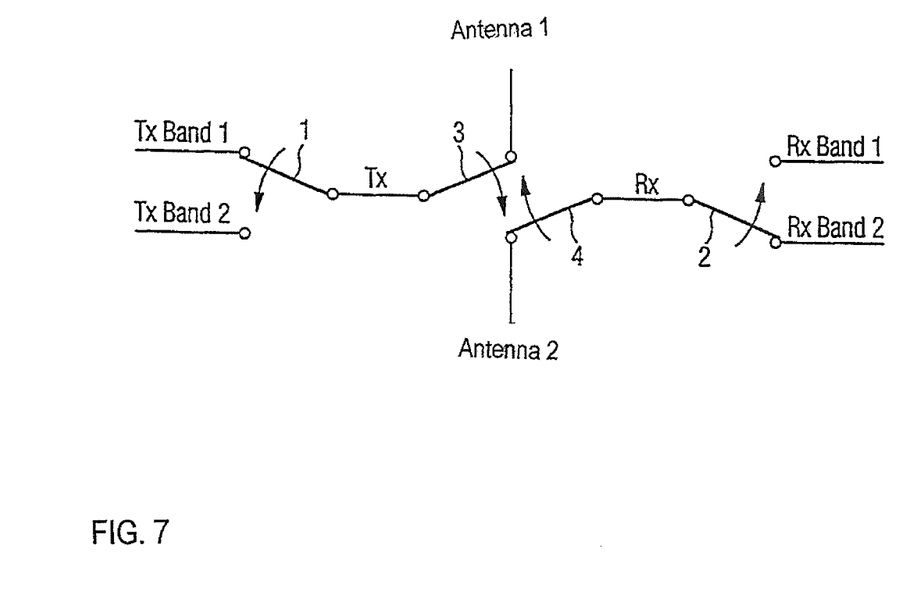
FIG. 7 is a further circuit diagram of a high-frequency switch, which can be used as high-frequency power switch.

FIG. 7 shows a further circuit diagram of a high-frequency circuit, which can be used as high-frequency power switch. Here, the circuit diagram illustrated in FIG. 7 comprises two transmitter inputs Tx band 1 and Tx band 2, as well as two receiver inputs Rx Band 1 and Rx Band 2. Further, the circuit diagram illustrates in FIG. 7 comprises a terminal for a first antenna (antenna 1) and a terminal for a second antenna (antenna 2). Via a first switch 1, a signal can be applied from a first transmitter input (Tx Band 1) or from the second transmitter input (Tx Band 2) to a transmitter branch (Tx). Via a second switch, a signal can be applied from a receiver branch (Rx) of the circuit diagram illustrated in FIG. 7 to a first receiver terminal (Rx Band 1) or a second receiver terminal (Rx Band 2). Further, a signal from the transmitter branch (Tx) can be supplied to the first antenna (antenna 1) or the second antenna (antenna 2) via a third switch, wherein the respective other of the first or second antennas is coupled to the receiver branch (Rx) via a fourth switch. Thereby, a separation of the signals to a first antenna (antenna 1) or a second antenna (antenna 2) can be realized, while at the same time a favourable separation between transmitter or receiver branch, respectively, can be performed. Here, it has to be considered that each switch 1 to 4 illustrated in FIG. 7 can be realized by one or several of the inventive high-frequency switching transistors. Particularly, for example the first switch can be arranged between the transmitter branch (Tx) and the first transmitter terminal (Tx band 2) by an arrangement of one or a series circuit of several of the inventive high frequencies switching transistors between the first transmitter terminal (Tx band 1) and the transmitter branch (Tx) from one or several open-circuited inventive high-frequency switching transistors. In that case, the control of such a "switch circuit" can be designed such the transistor (or the series circuit of transistors) is switched through between the first transmitter terminal (Tx band 1) and the transmitter branch (Tx) by a signal, while (for example by a respective inverse signal) the transistor (or the series circuit of transistors) is blocked between the second transmitter terminal (Tx band 2) and the transmitter branch (Tx). An analogous connectivity can also be used for the second switch 2, for the third switch 3 as well as for the fourth switch 4.

Figure 8:
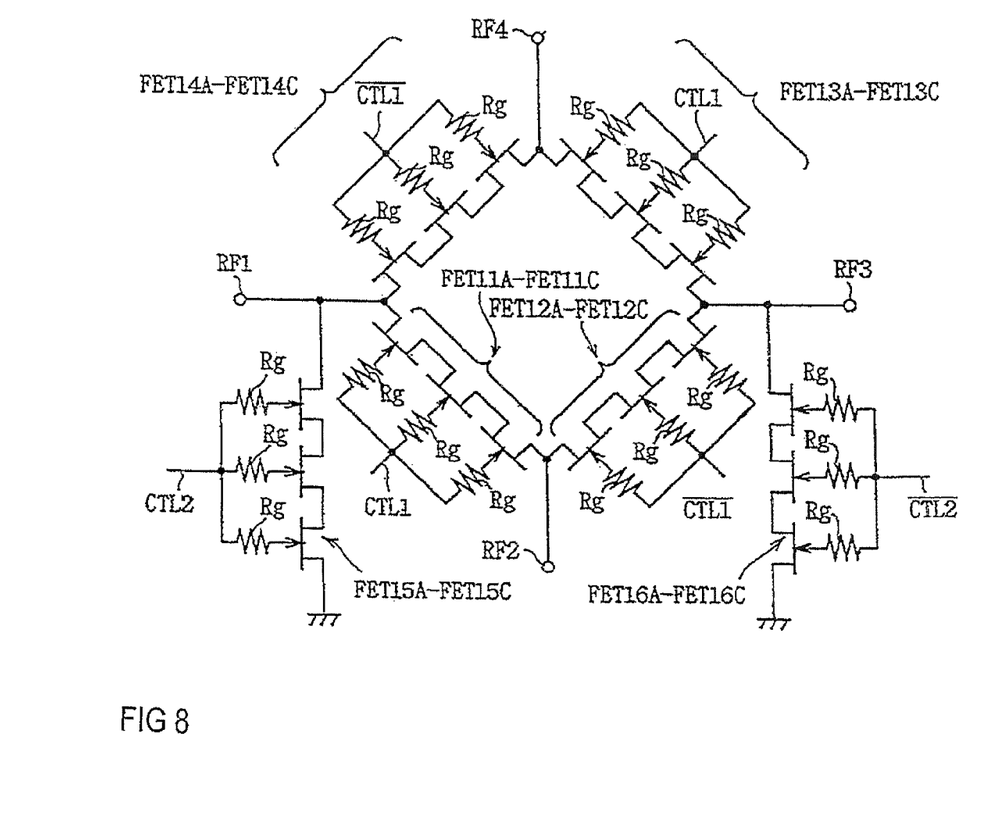
FIG. 8 is a further circuit diagram of a high-frequency circuit, which can be used as high-frequency power switch.

Such an arrangement of switches between four terminals is illustrated exemplarily in the further circuit diagram illustrated in FIG. 8. Here, the terminal RF1 can, for example, correspond to the transmitter branch Tx in FIG. 7, the terminal RF3 to the receiver branch Rx, the terminal RF2 to the terminal for the second antenna (antenna 2) and the terminal RF4 to the terminal for the first antenna (antenna 1) in FIG. 7. Then, the third switch can be realized by the transistors FET14A-FET14C, as well as the transistors FET11A-FET11C, which is controlled by the control signal CTL1 or the inverse control signal $\overline{CTL1}$, respectively. This means that during switching through the chain of transistors FET11A-FET11C, i.e., during switching through a signal from the terminal RF1 to the terminal RF2, the transistor chain FET14A-FET14C is blocked and thus a connection branch between a terminal RF1 and terminal RF4 is interrupted. Analogously, this applies for the transistor chain FET13A-FET13C between the terminal RF3 and the terminal RF4 and the transistor chain FET12A-FET12C between the terminal RF3 and the terminal RF2. If, again the transistor chain is switched through by the signal CTL1 to the transistors FET13A-FET13C, again, a connection between the terminal RF3 and the terminal RF2 through the transistor chain with the transistors FET12A-FET12C by the inverse control signal $\overline{CTL1}$ is open, i.e., a connection between the terminal RF3 and the terminal RF2 is disconnected. If for controlling the transistor chain with the transistor FET13A-FET13C and FET12A-FET12C the same control signal CTL1 will be used for controlling the transistor chains between the terminals RF1 and RF4 and RF1 and RF2 in the described form, thus, during switching through a signal from terminal RF1 to the terminal RF2 a signal is switched from the terminal RF3 to the terminal RF4 at the same time, while a connection between the terminal RF1 and the terminal RF4 and the terminal RF3 and the terminal RF2 is interrupted. Hereby, again, a very good insulation between separated signal terminals can be realized when the inventive high-frequency switching transistor is used as a switching element.

A further improvement can be introduced when at the same time the terminal RF1 is connected to a ground potential terminal via a transistor or the transistor chain with the transistors FET 15A-FET15C, and the terminal RF3 is connected to ground potential via a transistor or a transistor chain with the transistors FET16A-FET16C, and when the control of the transistor chain between the terminal RF1 and the ground potential is controlled by a second control signal $\overline{CTL2}$ and the transistor chain between the terminal RF3 and the ground potential with the inverse second control signal $\overline{CTL2}$. In that case, a conductive connection between the terminal RF1 and the ground potential is given, while a conductive connection between ground potential and the terminal RF3 is disconnected and vice versa.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A circuit with a first terminal, a second terminal, a third terminal and a fourth terminal, comprising:
    a first switch, which is formed to switch a first signal from the first terminal to the second terminal or from the first terminal to the fourth terminal; and
    a second switch, which is formed to switch a second signal from the third terminal to the second terminal or from the third terminal to the fourth terminal,
    wherein the first switch comprises a first switching element with a first high-frequency switching transistor, which is connected between the first terminal and the second terminal, and a second switching element with a second high-frequency switching transistor, which is connected between the first terminal and the fourth terminal, and
    wherein the second switch comprises a third switching element with a third high-frequency transistor, which is connected between the third terminal and the second terminal and comprises a fourth switching element with a fourth high-frequency switching transistor, which is connected between the third terminal and the fourth terminal,
    wherein the first, second, third and fourth high-frequency switching transistors are controllable such that the fourth high-frequency switching transistor is opened when the first high-frequency switching transistor is opened, the fourth high-frequency switching transistor is closed when the first high-frequency switching transistor is closed, the third high-frequency switching transistor is opened when the second high-frequency switching transistor is opened, and the third high-frequency switching transistor is closed when the high-frequency switching transistor is closed;
    wherein the first, second, third and fourth high-frequency switching transistors comprise:
    a substrate having a substrate dopant concentration;
    a barrier region bordering on the substrate, comprising a first conductivity type and having a barrier region dopant concentration, which is higher than the substrate dopant concentration;
    a source region embedded in the barrier region, comprising a second conductivity type different to the first conductivity type, and having a source region dopant concentration, which is higher than the barrier region dopant concentration;
    a drain region embedded in the barrier region and disposed offset from the source region, comprising the second conductivity type and having a dopant concentration, which is higher than the barrier region dopant concentration;
    a channel region disposed between the source region and the drain region, wherein the channel region comprises a subregion of the barrier region; and
    an insulation region, which covers the channel region and is disposed between the channel region and a gate electrode.

2. The circuit according to claim 1, wherein the first, second, third and fourth switching elements comprise one series circuit each of several high-frequency switching transistors, comprising:
    a substrate having a substrate dopant concentration;
    a barrier region bordering on the substrate, comprising a first conductivity type and having a barrier region dopant concentration, which is higher than the substrate dopant concentration;
    a source region embedded in the barrier region, comprising a second conductivity type different to the first conductivity type, and having a source region dopant concentration, which is higher than the barrier region dopant concentration;
    a drain region embedded in the barrier region and disposed offset from the source region, comprising the second conductivity type and having a dopant concentration, which is higher than the barrier region dopant concentration;

a channel region disposed between the source region and the drain region, wherein the channel region comprises a subregion of the barrier region; and an insulation region, which covers the channel region and is disposed between the channel region and a gate electrode.

3. The circuit according to claim 1, wherein the first terminal is connectable to a ground potential via a fifth switching element, and wherein the third terminal is connectable to a ground potential via a sixth switching element, wherein each of the fifth and the sixth switching elements comprises one high-frequency switching transistor, comprising:

a substrate having a substrate dopant concentration;

a barrier region bordering on the substrate, comprising a first conductivity type and having a barrier region dopant concentration, which is higher than the substrate dopant concentration;

a source region embedded in the barrier region, comprising a second conductivity type different to the first conductivity type, and having a source region dopant concentration, which is higher than the barrier region dopant concentration;

a drain region embedded in the barrier region and disposed offset from the source region, comprising the second conductivity type and having a dopant concentration, which is higher than the barrier region dopant concentration;

a channel region extending between the source region and the drain region, wherein the channel region comprises a subregion of the barrier region; and an insulation region, which covers the channel region and is disposed between the channel region and a gate electrode, and wherein the circuit is formed to control the fifth and sixth switching elements such that when the high-frequency switching transistor of the fifth switching element is closed, the high-frequency switching transistor of the sixth switching element is opened, and that when the high-frequency switching transistor of the fifth switching element is opened, the high-frequency switching transistor of the sixth switching element is closed.

\* \* \* \* \*